(12) United States Patent
Guo et al.

(10) Patent No.: US 11,742,556 B2
(45) Date of Patent: Aug. 29, 2023

(54) MEMS PHASE SHIFTER INCLUDING A SUBSTRATE WITH A COPLANAR WAVEGUIDE SIGNAL STRUCTURE FORMED THEREON AND ELECTRICALLY INSULATED FROM A METAL FILM BRIDGE

(71) Applicants: Beijing BOE Technology Development Co., Ltd., Beijing (CN); BOE TECHNOLOGY GROUP CO., LTD., Beijing (CN)

(72) Inventors: Jingwen Guo, Beijing (CN); Qianhong Wu, Beijing (CN); Chunxin Li, Beijing (CN); Feng Qu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/514,361

(22) Filed: Oct. 29, 2021

(65) Prior Publication Data
US 2022/0302566 A1 Sep. 22, 2022

(30) Foreign Application Priority Data
Mar. 16, 2021 (CN) .......................... 202110280376.2

(51) Int. Cl.
*H01P 1/18* (2006.01)
*B81B 7/02* (2006.01)
*H01P 1/10* (2006.01)

(52) U.S. Cl.
CPC ................ *H01P 1/184* (2013.01); *B81B 7/02* (2013.01); *H01P 1/10* (2013.01); *H01P 1/182* (2013.01); *B81B 2203/0109* (2013.01); *B81B 2203/04* (2013.01); *B81B 2207/015* (2013.01)

(58) Field of Classification Search
CPC .. H01P 1/18; H01P 1/184; H01P 1/185; H01P 1/10; H01P 9/00; B81B 7/02
USPC .......................................................... 333/161
See application file for complete search history.

(56) References Cited

U.S. PATENT DOCUMENTS

| 7,259,641 B1 * | 8/2007 | Weller et al. ........... H01P 1/184 333/156 |
| 2015/0180108 A1 * | 6/2015 | Ziaei et al. ............. H01P 3/082 333/1.1 |
| 2018/0219286 A1 * | 8/2018 | Lee et al. ............. H01Q 3/2682 |

* cited by examiner

*Primary Examiner* — Benny T Lee
(74) *Attorney, Agent, or Firm* — HOUTTEMAN LAW LLC (57) ABSTRACT

A MEMS phase shifter, including: a substrate; a coplanar waveguide signal structure on the substrate; two coplanar waveguide ground wires respectively at two sides of the coplanar waveguide signal structure; insulating isolation layers respectively on the two coplanar waveguide ground wires; and a metal film bridge across and over the coplanar waveguide signal structure and forming a gap with the coplanar waveguide signal structure, both ends of the metal film bridge respectively attached to the insulating isolation layers on the two coplanar waveguide ground wires, wherein an insulating dielectric layer is provided on the coplanar waveguide signal structure, and the insulating dielectric layer comprises at least one concave part, which is concave in the direction towards the substrate, on the surface facing the metal film bridge.

18 Claims, 6 Drawing Sheets

MEMS PHASE SHIFTER INCLUDING A SUBSTRATE WITH A COPLANAR WAVEGUIDE SIGNAL STRUCTURE FORMED THEREON AND ELECTRICALLY INSULATED FROM A METAL FILM BRIDGE

CROSS REFERENCE TO RELATED APPLICATIONS

The present disclosure claims the priority of the Chinese Patent Application No. 202110280376.2 entitled "MEMS phase shifter" filed on Mar. 16, 2021, the entirety of which is incorporated herein by reference.

TECHNICAL FIELD

The present disclosure belongs to the field of microwave communication technology, and particularly relates to a MEMS phase shifter.

BACKGROUND

As the information age has rapidly developed, wireless terminals with high integration, miniaturization, multifunction, and low cost have gradually become a trend of communication technology. Phase shifters are essential key components in communication and radar applications. A traditional phase shifter mainly includes a ferrite phase shifter and a semiconductor phase shifter, where the ferrite phase shifter has relatively large power capacity and the insertion loss thereof is relatively low, but the large-scale application of the ferrite phase shifter is limited by factors such as complex process, high manufacturing cost, large volume and the like; the semiconductor phase shifter has small volume and high working speed, but has relatively small power capacity, large power consumption and high process difficulty. Compared with the traditional phase shifter, the MEMS phase shifter has obvious advantages in the aspects of insertion loss, power consumption, volume, cost and the like, and has attracted wide attention in the fields of radio communication, microwave technology and the like. However, some problems of the MEMS phase shifter itself also need to be solved, and it is a more outstanding problem that the film bridge cannot be reset due to adhesion of the film bridge caused by dielectric charging during electrostatic driving. How to solve the failure caused by dielectric charging is an important subject in the MEMS device.

SUMMARY OF THE INVENTION

The present disclosure aims to solve at least one of the problems of the prior art, and provides a MEMS phase shifter including: a substrate; a coplanar waveguide signal structure on the substrate; two coplanar waveguide ground wires respectively at two sides of the coplanar waveguide signal structure; insulating isolation layers respectively on the two coplanar waveguide ground wires; and a metal film bridge across and over the coplanar waveguide signal structure and forming a gap with the coplanar waveguide signal structure, both ends of the metal film bridge respectively attached to the insulating isolation layers on the two coplanar waveguide ground wires, wherein an insulating dielectric layer is provided on the coplanar waveguide signal structure facing the metal film bridge, and the insulating dielectric layer includes at least one concave part, which is concave in a direction towards the substrate, on a surface facing the metal film bridge.

In the MEMS phase shifter provided by the embodiment of the disclosure, the insulating dielectric layer arranged on the coplanar waveguide signal structure includes at least one concave part which is concave in the direction towards the substrate on the surface facing the metal film bridge, so that the failure of the MEMS phase shifter caused by the charging of the insulating dielectric layer during the electrostatic driving of the MEMS phase shifter can be reduced.

In one embodiment, the coplanar waveguide signal structure includes a driving electrode and a coplanar waveguide signal line around and spaced apart from the driving electrode; and an orthographic projection of the concave part on the substrate at least partially overlaps an orthographic projection of the driving electrode on the substrate.

In one embodiment, the insulating dielectric layer includes a plurality of insulating dielectric structures separated from each other; and the plurality of insulating dielectric structures are disposed only on the coplanar waveguide signal line.

In one embodiment, the MEMS phase shifter further includes a switching transistor, and the switching transistor is configured to apply a direct current driving voltage between the driving electrode and the metal film bridge.

In one embodiment, the orthographic projection of the driving electrode on the substrate is a polygon with right or rounded corners, or is circular or oval.

In one embodiment, the coplanar waveguide signal line includes two branches respectively on two opposite sides of the driving electrode, and two of the insulating dielectric structures are disposed respectively on the two branches.

In one embodiment, each of the two of the insulating dielectric structures covers a surface of the corresponding branch facing the metal film bridge and two side surfaces of the corresponding branch.

In one embodiment, an inner edge of an orthographic projection of the coplanar waveguide signal lines on the substrate has a shape of a polygon, a circle or an oval; and the polygon has inner angles of obtuse angles.

In one embodiment, the orthographic projection of the driving electrode on the substrate is a rectangle with rounded corners, which includes a first side and a third side as long sides of the rectangle; and the orthographic projection of the coplanar waveguide signal line on the substrate is an octagon, which includes a second side and a fourth side which are parallel to the first side and the third side and are arranged at a side of the first side away from the third side and a side of the third side away from the first side, respectively, and the two of the insulating dielectric structures are arranged on the second side and the fourth side, respectively.

In one embodiment, the insulating dielectric structure on each of the two branches includes a plurality of insulating dielectric microstructures arranged in an array, the plurality of insulating dielectric microstructures being spaced apart from each other on a side facing the metal film bridge.

In one embodiment, each of the plurality of insulating dielectric microstructures is cylindrical, truncated cone-shaped, or conical on the side facing the metal film bridge.

In the MEMS phase shifter of the above embodiments, the driving electrode and the coplanar waveguide signal line are separately disposed, and the driving electrode and the coplanar waveguide signal line together form the coplanar waveguide signal structure of the present disclosure, and the plurality of insulating dielectric structures are disposed only on the coplanar waveguide signal line, such that no insulating dielectric layer is disposed on the driving electrode, so that the charging effect of the insulating dielectric layer during electrostatic driving can be reduced, such that the influence of an electric field built in the insulating dielectric on the MEMS phase shifter can be reduced, the service life and response speed of the MEMS phase shifter can be improved, and the operating voltage of the MEMS phase shifter can be kept stable.

In one embodiment, the coplanar waveguide signal structure includes a coplanar waveguide signal line arranged in parallel with the two coplanar waveguide ground wires; and the insulating dielectric layer includes a plurality of insulating dielectric microstructures spaced apart from each other on a side facing the metal film bridge.

In one embodiment, each of the plurality of insulating dielectric microstructures is cylindrical, truncated cone-shaped or conical on the side facing the metal film bridge.

In one embodiment, a material of the plurality of insulating dielectric microstructures includes optically clear adhesive, photoresist or polyimide.

In the above embodiments, the driving electrode and the coplanar waveguide signal line are of a single-piece structure, the coplanar waveguide signal structure of the single-piece structure is provided with the insulating dielectric layer made of an organic material, and the insulating dielectric layer includes a plurality of insulating dielectric microstructures spaced apart from each other on a side facing the metal film bridge, so that the contact area of the metal film bridge with the insulating dielectric layer when the metal film bridge is pulled down and picked up by the insulating dielectric layer can be reduced, and by utilizing the characteristics that vacancies are few in the organic material due to long-chain cross-linking of the organic material, the charge injection effect is reduced and the influence of the failure caused by charging is weakened.

In one embodiment, the metal film bridge includes a plurality of bumps in an array protruding in a direction toward the coplanar waveguide signal structure, the plurality of bumps being spaced apart from each other on a side toward the coplanar waveguide signal structure.

In one embodiment, the material of the protrusion includes an organic material or a metallic material.

In the above embodiments, a plurality of protrusions, which may be made of an organic material or a metallic material that is easily joined to the metal film bridge, are added under the metal film bridge, and since a gap exists between two adjacent protrusions on a side of the plurality of protrusions facing the coplanar waveguide signal line, the adhesion resistance is increased and the resistance to the failure caused by dielectric charging is enhanced.

BRIEF DESCRIPTION OF DRAWINGS

Embodiments of the present disclosure will be described in more detail below with reference to the accompanying drawings, in which.

DETAIL DESCRIPTION OF EMBODIMENTS

In order to make the objects, technical solutions and advantages of the present disclosure more apparent, the present disclosure will be described in further detail below with reference to the accompanying drawings, where like features are denoted by the same reference labels throughout the drawings and detail description thereof, and it is apparent that the described embodiments are only some embodiments of the present disclosure, not all embodiments. All other embodiments, which can be derived by a person skilled in the art from the embodiments disclosed herein without making any creative effort, shall fall within the protection scope of the present disclosure.

The shapes and sizes of the components in the drawings are not drawn to scale, but are merely intended to facilitate an understanding of the contents of the embodiments of the present disclosure.

Unless defined otherwise, technical or scientific terms used herein shall have the ordinary meaning as understood by one of ordinary skilled in the art to which this disclosure belongs. The use of the terms "first", "second" and the like in this disclosure is not intended to indicate any order, quantity, or importance, but rather is used to distinguish one element from another. Also, the use of the terms "a", "an", "the" or the like does not denote a limitation of quantity, but rather denotes the presence of at least one element or item following the term. The word "comprising", "comprises" or the like means that the element or item preceding the word comprises the element or item listed after the word and its equivalent, but does not exclude other elements or items. The term "connected", "coupled" or the like is not restricted to physical or mechanical connections, but may include electrical connections, whether direct or indirect. The term "upper", "lower", "left", "right" or the like is used only to indicate a relative positional relationship, and when the absolute position of the object being described is changed, the relative positional relationship may also be changed accordingly.

In a traditional MEMS phase shifter based on a coplanar waveguide transmission line, MEMS metal film bridges are periodically arranged on a coplanar waveguide, and the MEMS metal film bridges are equivalent to parallel-connected capacitors in a circuit model, so that when the height of a MEMS metal film bridge is changed, the capacitance characteristics of the whole transmission line is changed, the phase speed of electromagnetic waves capable of being transmitted in the transmission line is accordingly changed, and finally the phase shift is changed. The metal film bridge of the MEMS phase shifter is called "on" when not being pulled down and "off" when being pulled down.

The MEMS phase shifter generally includes a substrate, a coplanar waveguide signal line formed on the substrate, two coplanar waveguide ground wires on both sides of the coplanar waveguide signal line, and a MEMS metal film bridge bridged across and over the coplanar waveguide signal line and having both ends disposed on the two coplanar waveguide ground wires, respectively. The coplanar waveguide signal line and the two coplanar waveguide ground wires extend in substantially parallel directions on the substrate. A material of the substrate may be a high-resistance silicon substrate, and a $SiO_2$ layer may be arranged on the substrate to improve the loss characteristics of the device; the coplanar waveguide signal line, the coplanar waveguide ground wires and the MEMS metal film bridge each are made of a conductive material such as gold (Au), and a $Si_3N_4$ dielectric layer is disposed on the coplanar waveguide signal line at a position corresponding to the metal film bridge to isolate the coplanar waveguide signal line from the MEMS metal film bridge when the MEMS metal film bridge is pulled down.

When the MEMS phase shifter works, a direct-current driving voltage is directly applied between the coplanar waveguide signal line and the metal film bridge, such that an electrostatic field is generated between the coplanar waveguide signal line and the metal film bridge to drive the metal film bridge to move. When the metal film bridge is pulled down to be in direct contact with the dielectric layer, as the metal film bridge and the coplanar waveguide signal line each are made of a conductive metal, the metal film bridge and the coplanar waveguide signal line may be equivalent to a capacitor, and the metal film bridge and the coplanar waveguide signal line form an upper electrode plate and a lower electrode plate, respectively of a capacitor and are in close contact with the dielectric layer to form a capacitor contact region. Since the dielectric layer has a thickness of about 0.2 μm to 1 μm and the driving voltage is about 20V to 50V, a strength of the electric field at the capacitor contact region is as high as $10^7$V/m. Under the action of such a strong electric field force, free electrons in the metal may be injected into the dielectric layer and are captured by traps in the dielectric layer, and are difficult to release and cause gradual charge accumulation. When the charges are accumulated to a certain degree, an electric field generated by the accumulated charges can influence the normal operation of the phase shifter, so that the driving voltage drifts, the metal film bridge is adsorbed to the dielectric layer and is difficult to be separated from the dielectric layer, and the device fails.

In order to solve the above problem, the present disclosure provides a MEMS phase shifter including: a substrate; a coplanar waveguide signal structure on the substrate; two coplanar waveguide ground wires respectively at two sides of the coplanar waveguide signal structure; insulating isolation layers respectively on the two coplanar waveguide ground wires; and a metal film bridge across and over the coplanar waveguide signal structure and forming a gap with the coplanar waveguide signal structure, respective ends of the metal film bridge attached to the corresponding insulating isolation layers on the two coplanar waveguide ground wires, and an insulating dielectric layer is provided on a surface of the coplanar waveguide signal structure facing the metal film bridge, and the insulating dielectric layer includes at least one concave part, which is concave in a direction towards the substrate, on a surface facing the metal film bridge.

In one embodiment, the coplanar waveguide signal structure includes a driving electrode and a coplanar waveguide signal line around and spaced apart from the driving electrode, and the concave part is arranged at a position corresponding to the driving electrode, i.e., an orthographic projection of the concave part on the substrate at least partially overlaps an orthographic projection of the driving electrode on the substrate.

In the MEMS phase shifter provided by the embodiment of the disclosure, the insulating dielectric layer arranged on the coplanar waveguide signal structure includes a plurality of insulating dielectric structures which are spaced apart from each other, and gaps exist among the plurality of insulating dielectric structures, so that a contact area between the metal film bridge and the insulating dielectric layer when the metal bridge is pulled down is reduced, the adhesion risk is reduced, the failure of the MEMS phase shifter caused by the charging of the insulating dielectric layer during the electrostatic driving process of the MEMS phase shifter is reduced, the service life of the MEMS phase shifter is prolonged, and the working stability of the MEMS phase shifter is enhanced.

Figure 1:
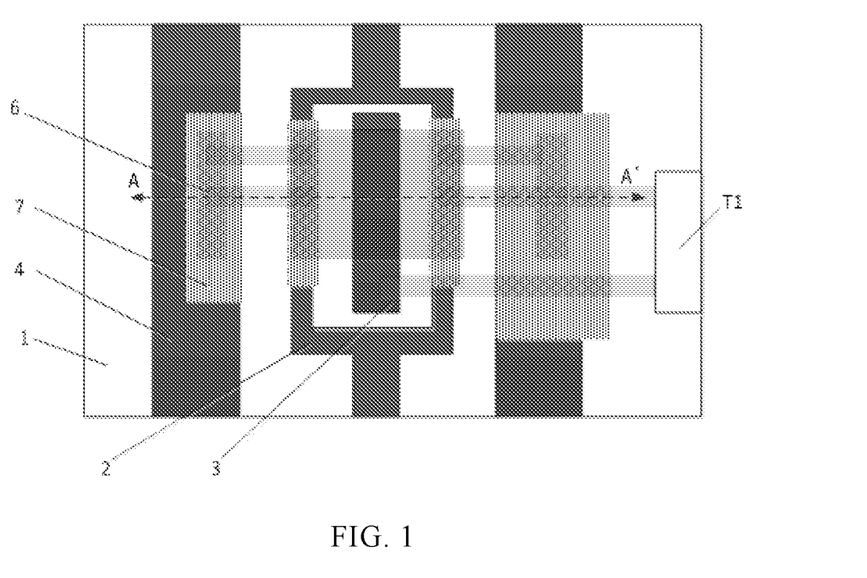
FIG. 1 illustrates a schematic top view of a MEMS phase shifter according to an embodiment of the present disclosure.
Figure 2:
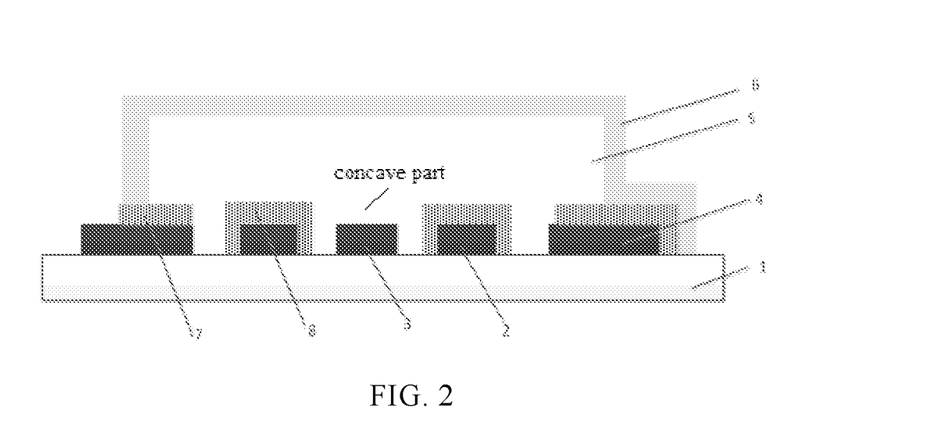
FIG. 2 illustrates a schematic cross-sectional structural view of a MEMS phase shifter according to an embodiment of the present disclosure taken along an AA' line shown in FIG. 1.

Specifically, as shown in FIGS. 1 and 2, FIG. 2 illustrates a schematic cross-sectional view of the MEMS phase shifter shown in FIG. 1 taken along an AA' line. The MEMS phase shifter of the embodiment of the disclosure includes: a substrate 1, a coplanar waveguide signal structure (including a coplanar waveguide signal line 2 and a driving electrode 3) on the substrate 1, two coplanar waveguide ground wires 4 respectively arranged at two sides of the coplanar waveguide signal line 2, an insulating dielectric layer 8 (FIG. 2) on the coplanar waveguide signal line 2, insulating isolation layers 7 on the coplanar waveguide ground wires 4, and a metal film bridge 6 which is across and over the coplanar waveguide signal structure and has two ends respectively attached to the insulating isolation layers 7 on the coplanar waveguide ground wires 4. A gap 5 (FIG. 2) is formed between the coplanar waveguide signal structure and the metal film bridge 6 which is across and over the coplanar waveguide signal structure. As shown in FIG. 1, the MEMS phase shifter of the present disclosure further includes a switching transistor T1 connecting the metal film bridge 6 and the driving electrode 3 to an external DC driving power supply for applying a DC driving voltage from the DC driving power supply between the driving electrode 3 and the metal film bridge 6.

In this embodiment, a material of the substrate 1 may be, for example, a high-resistance silicon substrate, on which a thin layer of $SiO_2$ (not shown in the drawings) may be provided to improve loss characteristics of the device; the coplanar waveguide signal line 2, the driving electrode 3, the coplanar waveguide ground wires 4 and the metal film bridge 6 each are made of a conductive material such as gold (Au), and a $SiO_2$ or $Si_3N_4$ dielectric layer is provided as an insulating dielectric layer on the coplanar waveguide signal line 2 at a position corresponding to the metal film bridge 6 to isolate the coplanar waveguide signal line 2 from the metal film bridge 6 when the metal film bridge 6 is pulled down. However, the present disclosure is not limited thereto.

Figure 3:
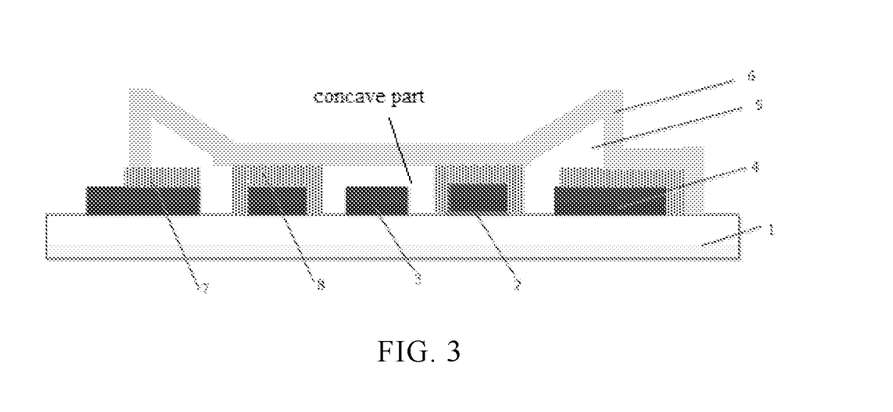
FIG. 3 illustrates a schematic view of an operating state of a MEMS phase shifter according to an embodiment of the present disclosure.

In the MEMS phase shifter of the present embodiment, the driving electrode 3 and the coplanar waveguide signal line 2 are disposed to be separated from each other, and the insulating dielectric layer such as $SiO_2$ or $Si_3N_4$ is disposed only on the coplanar waveguide signal line 2 and not on the driving electrode 3, so that the metal film bridge 6 does not contact the driving electrode 3 when the metal film bridge 6 is pulled down and adsorbed to the coplanar waveguide signal structure when a DC driving voltage is applied between the metal film bridge 6 and the driving electrode 3, as shown in FIG. 3. In this embodiment, in such an arrangement in which the coplanar waveguide signal line and the driving electrode are separated from each other, the insulating dielectric layer is provided only on the coplanar waveguide signal line, so that the insulating dielectric layer is formed to include a plurality of insulating dielectric structures separated from each other. That is, a concave part being concave towards the substrate is provided on the surface of the entire insulating dielectric layer facing the metal film bridge 6, and the space between the separated insulating dielectric structures corresponds to the concave part which directly exposes the driving electrode 3 to the metal film bridge 6. The insulating dielectric structure has two functions; firstly, the insulating dielectric structure is used as a support of the metal film bridge, and the metal film bridge is supported when the metal film bridge is pulled down and picked up, so that the metal film bridge is prevented from being in contact with the driving electrode to cause short circuit, as shown in FIG. 3; and secondly, the metal film bridge is separated from the coplanar waveguide signal line 2, so that the phenomenon that return loss of the MEMS phase shifter is too large when the metal film bridge is pulled down and adsorbed to the coplanar waveguide signal line 2 is prevented from occurring, such that the performance of the phase shifter will not be influenced. That is, in the present embodiment, no insulating dielectric structure is provided on the driving electrode 3 as a dielectric isolation layer, so that the dielectric charging effect under the driving of an electrostatic field is avoided. That is, in the present embodiment, no insulating dielectric structure is provided on the driving electrode 3, and insulating dielectric structures are provided only on portions of the coplanar waveguide signal line 2 at both sides of the driving electrode 3, the two insulating dielectric structures being separated by the driving electrode 3 therebetween. Therefore, as shown in FIG. 3, when the metal film bridge 6 is pulled down and adsorbed to the coplanar waveguide signal structure, the metal film bridge will not be adsorbed to the driving electrode 3, so that the charging effect of the insulating dielectric layer during electrostatic adsorption can be reduced, the influence of the built-in electric field of the insulating dielectric layer on the MEMS phase shifter can be reduced, the service life and the response speed of the MEMS phase shifter can be improved, and the operating voltage of the MEMS phase shifter can be kept stable.

In the MEMS phase shifter as shown in FIG. 2, the insulating dielectric layer on the coplanar waveguide signal line 2 may be made of the same material as in the conventional MEMS phase shifter, for example, an inorganic material such as $SiO_2$ or $Si_3N_4$. Since there are a large number of holes in the inorganic material and thus charge injection is likely to occur, in the embodiments of the present disclosure, the driving electrode and the coplanar waveguide signal line are provided as two discrete structures, and an insulating dielectric layer such as SiNx or SiO is not provided on the driving electrode for applying the direct-current driving voltage, thereby reducing the charging effect of the insulating dielectric layer during electrostatic driving.

In the MEMS phase shifter as shown in FIG. 2, the insulating isolation layers 7 and the insulating dielectric layer 8 may be prepared in one process step with the same inorganic material as described above. That is, the insulating isolation layers 7 may be made of an inorganic material such as $SiO_2$ or $Si_3N_4$. In addition, as shown in FIG. 2, in order to avoid a contact short circuit with the coplanar waveguide signal line 2 when the metal film bridge 6 is pulled down, the insulating dielectric layer 8 formed on the coplanar waveguide signal line 2 should preferably completely cover two side surfaces of the coplanar waveguide signal line 2.

FIG. 1 illustrates a top view of a MEMS phase shifter according to an embodiment of the present disclosure, in which a coplanar waveguide signal structure located between two coplanar waveguide ground wires 4 includes a coplanar waveguide signal line 2 and a driving electrode 3 which are spaced apart from each other. In the top view shown in FIG. 1, the orthographic projection of the driving electrode 3 on the substrate 1 is substantially rectangular, the coplanar waveguide signal line 2 disposed around the driving electrode 3 is substantially constituted by a rectangular ring structure and two extensions from both ends of the rectangular ring structure, and the driving electrode 3 is disposed inside the rectangular ring structure. That is, in the present embodiment, the coplanar waveguide signal line 2 has a bifurcated structure, which is bifurcated in an extending direction, and then the bifurcated parts are merged, thereby forming a structure surrounding the driving electrode 3.

Figure 4:
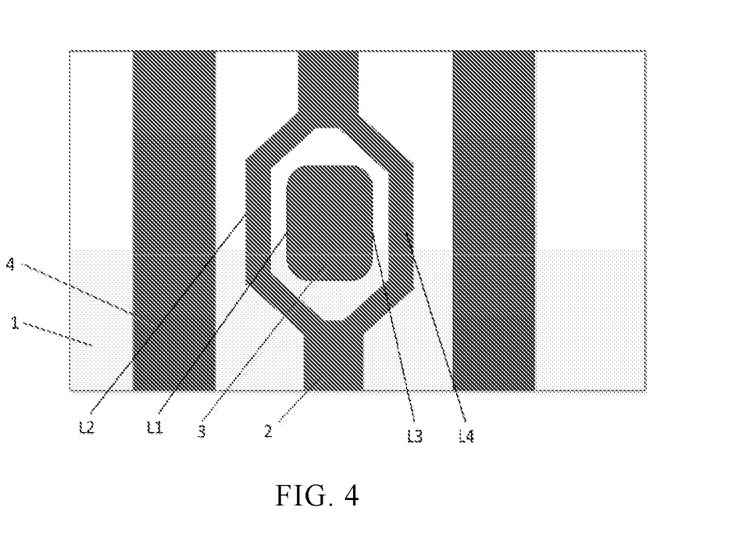
FIG. 4 illustrates a schematic structural view of a MEMS phase shifter, in which a driving electrode and a coplanar waveguide signal line are separated from each other, according to an embodiment of the present disclosure.

However, the present disclosure is not limited thereto, and as shown in FIG. 4, the orthographic projection of the driving electrode 3 on the substrate 1 is a rectangle with rounded corners, in which case the inner edge of the orthographic projection of the coplanar waveguide signal line 2 on the substrate 1 may be an octagon, and two insulating dielectric structures are provided on two branches of the coplanar waveguide signal line 2 at two opposite sides of the driving electrode 3, respectively. As shown in FIG. 4, the inner angles of the octagon are all obtuse angles. Specifically, the orthographic projection of the driving electrode 3 on the substrate 1 is a rectangle with rounded corners, which includes a first side L1 and a third side L3 as long sides of the rectangle; and the orthographic projection of the coplanar waveguide signal line 2 on the substrate 1 is an octagon, and the octagon includes a second side L2 and a fourth side L4 which are approximately parallel to the first side L1 and the third side L3, and are arranged outside the first side L1 and the third side L3, respectively, and the two insulating dielectric structures 8 (FIG. 2) are arranged on the second side L2 and the fourth side L4, respectively. The structure shown in FIG. 4 can ensure a stable transmission of the radio frequency signal in the signal line, reduce return loss and avoid signal reflection. However, the present disclosure is not limited thereto, and for example, the orthographic projection of the driving electrode 3 on the substrate 1 may be circular or oval, which is not limited by the present disclosure. The orthographic projection of the inner edges of the coplanar waveguide signal line 2 on the substrate 1 may be set to be polygonal, circular or oval. In a polygonal case, each of the inner angles of the polygon may be an obtuse angle, and a right angle or an acute angle should be avoided as much as possible.

Figure 5:
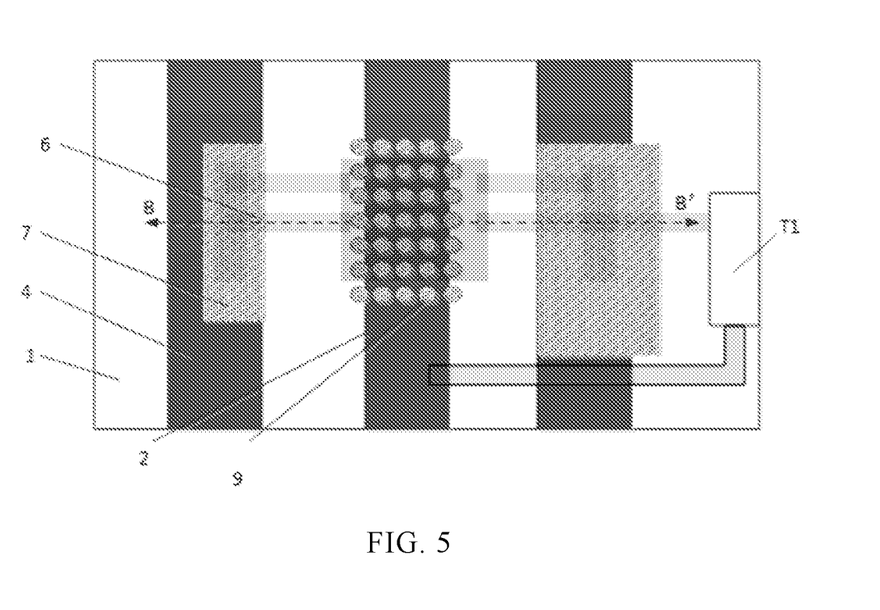
FIG. 5 illustrates a schematic top view of a MEMS phase shifter according to an embodiment of the present disclosure.

In an embodiment of the present disclosure, as shown in FIG. 5, a MEMS phase shifter of an embodiment of the present disclosure includes: a substrate 1, a coplanar waveguide signal line 2 on the substrate 1, two coplanar waveguide ground wires 4 arranged at two sides of the coplanar waveguide signal line 2, an insulating dielectric layer 8 on the coplanar waveguide signal line 2, insulating isolation layers 7 on the coplanar waveguide ground wires 4, and a metal film bridge 6 which is across and over the coplanar waveguide signal line 2 and both ends of which are respectively attached to the insulating isolation layers 7 on the coplanar waveguide ground wires 4. A gap 5 is formed between the coplanar waveguide signal line 2 and the metal film bridge 6 which is across and over the coplanar waveguide signal line 2. As shown in FIG. 5, the MEMS phase shifter of the present disclosure further includes a driving circuit, for example, the driving circuit includes a switching transistor T1, which connects the metal film bridge 6 and the coplanar waveguide signal line 2 to an external DC driving power supply, for applying a DC driving voltage supplied from the DC driving power supply between the coplanar waveguide signal line 2 and the metal film bridge 6. In this embodiment, the coplanar waveguide signal line 2 is also used as a driving electrode.

Figure 6:
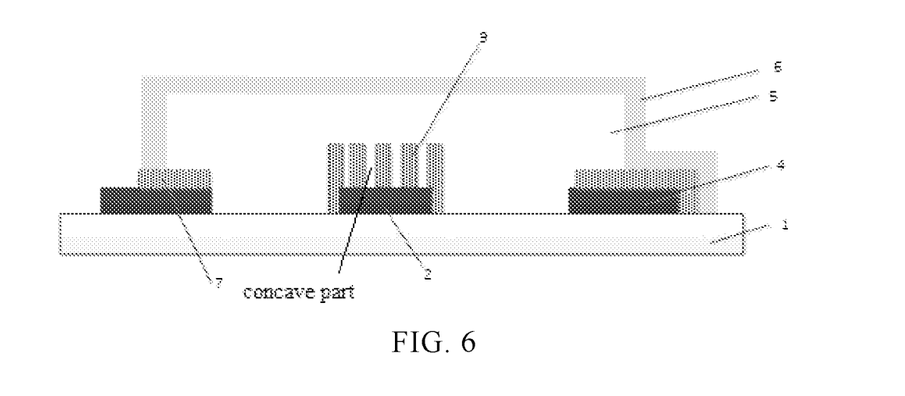
FIG. 6 illustrates a schematic cross-sectional structural view of a MEMS phase shifter according to an embodiment of the present disclosure taken along a BB' line of FIG. 5.
Figure 7:
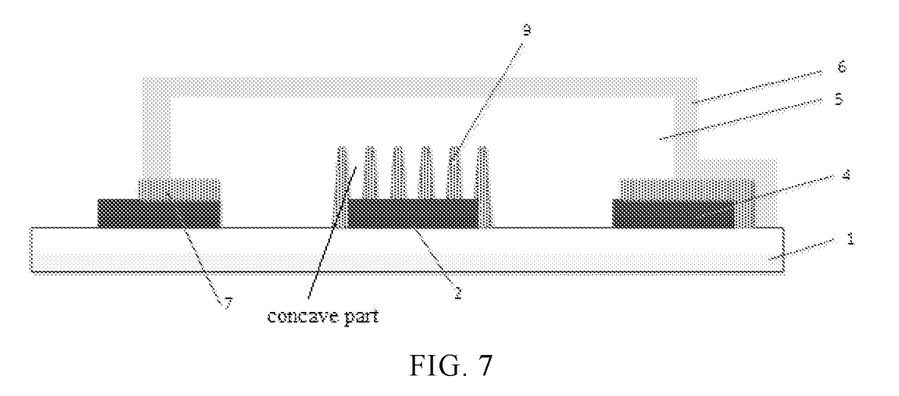
FIG. 7 illustrates a schematic cross-sectional structural view of a MEMS phase shifter according to an embodiment of the present disclosure.
Figure 8:
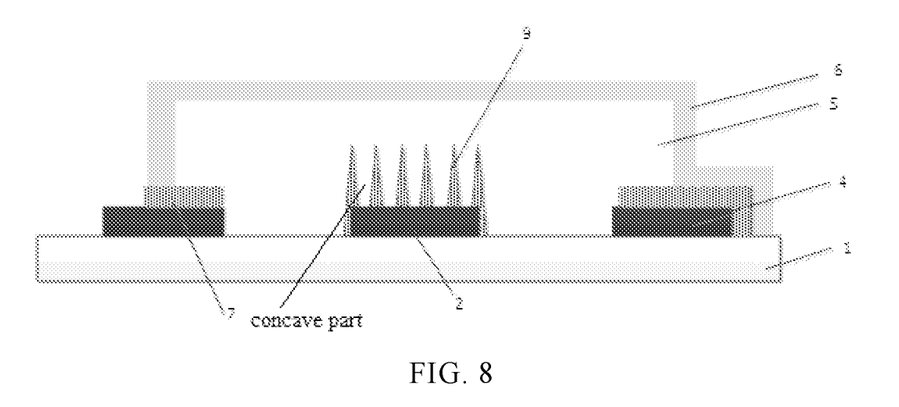
FIG. 8 illustrates a schematic cross-sectional structural view of a MEMS phase shifter according to an embodiment of the present disclosure.

In this embodiment, as shown in FIG. 5, the insulating dielectric layer includes a plurality of insulating dielectric microstructures 9 spaced apart from each other and arranged in an array, as shown in FIGS. 6 to 8, each of the plurality of insulating dielectric microstructures 9 may be cylindrical (FIG. 6), truncated cone-shaped (FIG. 7) or conical (FIG. 8). A material of the insulating dielectric microstructure includes an organic material such as Optically Clear Adhesive (OCA), Photoresist (PR) or Polyimide (PI).

In this embodiment, the insulating dielectric layer of the MEMS phase shifter is designed to include several separate structures. For example, as shown in FIG. 6, a plurality of insulating dielectric microstructures 9 arranged in an array of cylinders are adopted, where the plurality of insulating dielectric microstructures 9 are disposed on the coplanar waveguide signal line 2 (FIGS. 5 and 6), and a gap exists between two adjacent insulating dielectric microstructures 9, such an arrangement can reduce the contact area with the insulating dielectric layer when the metal film bridge 6 is picked up, so as to reduce the adhesion risk; in addition, the material of the insulating dielectric microstructure 9 may be replaced by an organic material (such as an Optically Clear Adhesive (OCA), a Photoresist (PR) or a Polyimide (PI)) from a traditional inorganic material such as SiNx or SiO, and the characteristics that vacancies are few in the organic material due to long-chain cross-linking of the organic material is fully utilized, so that the problem that charges are easy to inject into the inorganic material due to the vacancies in the inorganic material is solved, such that the charge injection effect of the insulating dielectric layer serving as an isolation layer is further reduced by utilizing the organic material, and the device failure caused by dielectric charging is further reduced.

Figure 9:
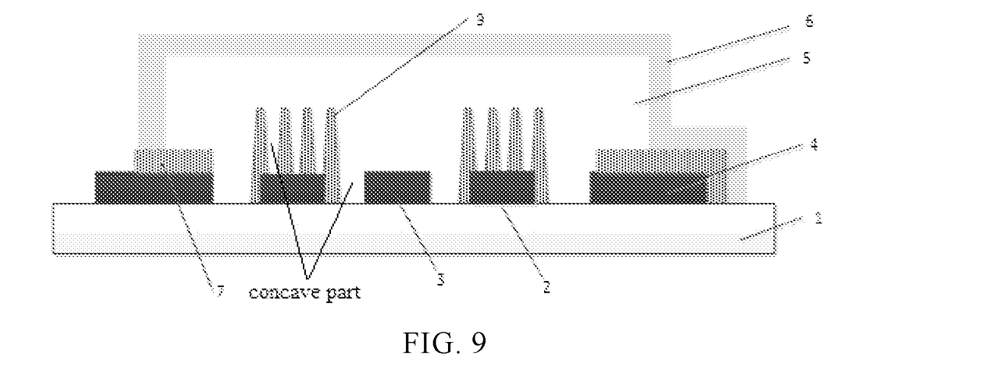
FIG. 9 illustrates a schematic cross-sectional structural view of a MEMS phase shifter according to an embodiment of the present disclosure.

Based on the insulating dielectric microstructures 9 in the embodiments shown in FIGS. 6 to 8, the plurality of insulating dielectric microstructures 9 arranged in an array may be used in the MEMS phase shifter in the embodiment shown in FIG. 2 instead of the insulating dielectric structures. In the embodiment shown in FIG. 9, the driving electrode 3 is disposed apart from the coplanar waveguide signal line 2, and for example, the arrangement of the driving electrode 3 and the coplanar waveguide signal line 2 as shown in FIGS. 1 and 4 may be adopted. In the embodiment shown in FIG. 9, which is the same as the embodiment shown in FIG. 2, the insulating dielectric microstructures 9 are provided only on the coplanar waveguide signal line 2, and not on the driving electrode 3. However, unlike the embodiment shown in FIG. 2, in the embodiment shown in FIG. 9, the insulating dielectric layer includes a plurality of insulating dielectric microstructures 9 arranged in an array, and each of the insulating dielectric microstructure 9 may be cylindrical, truncated cone-shaped, or conical as shown in FIGS. 6 to 8. As shown in FIG. 9, for the insulating dielectric layer, on the one hand, the insulating dielectric layer is only disposed on the two branches of the coplanar waveguide signal line 2 at the two sides of the driving electrode 3, and the insulating dielectric layer is not disposed above the driving electrode 3; on the other hand, a plurality of insulating dielectric microstructures 9 are arranged on each branch and spaced from each other. Therefore, when the metal film bridge 6 is pulled down and adsorbed to the insulating dielectric layer, on one hand, the metal film bridge 6 is not in contact with the driving electrode 3, and on the other hand, a gap exists between two adjacent insulating dielectric microstructures, so that the contact area of the metal film bridge 6 when being pulled down and adsorbed to the insulating dielectric layer is reduced, the adhesion risk is reduced, the failure of the MEMS phase shifter caused by the charging of the insulating dielectric layer during the electrostatic driving of the MEMS phase shifter is further reduced, the service life of the MEMS phase shifter is prolonged, and the working stability of the MEMS phase shifter is improved.

Figure 12:
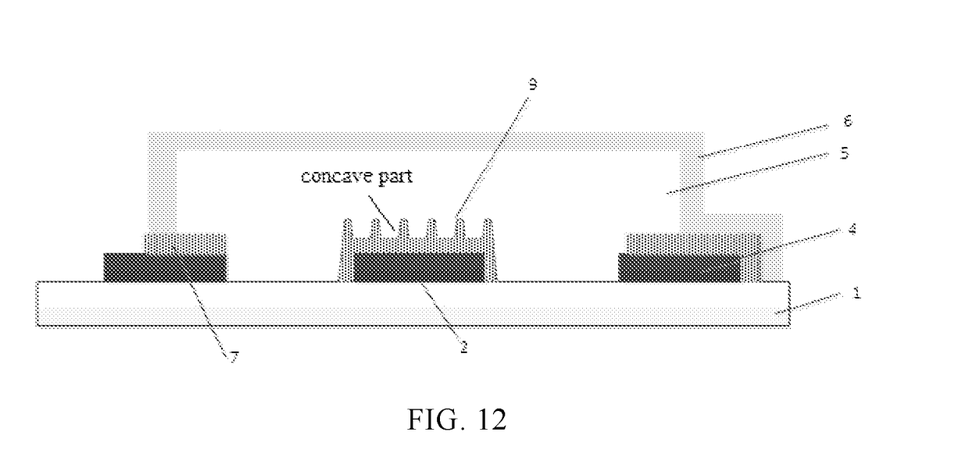
FIG. 12 illustrates a schematic cross-sectional structural view of a MEMS phase shifter according to an embodiment of the present disclosure.

As in the above embodiments shown in FIGS. 5 to 9, the insulating dielectric layer 8 is provided to include a plurality of insulating dielectric microstructures 9 completely spaced from each other, i.e. these insulating dielectric microstructures 9 are discrete on the substrate 1 and the coplanar waveguide signal line 2, but the disclosure is not limited thereto. For example, as shown in FIG. 12, the plurality of insulating dielectric microstructures 9 include ends spaced from each other on the side facing the metal film bridge 6, i.e. a concave part which is concave towards the substrate 1 is provided on the surface of the insulating dielectric layer facing the metal film bridge 6, while on the side away from the metal film bridge 6, insulating dielectric microstructures 9 may be formed as an integral structure.

Figure 10:
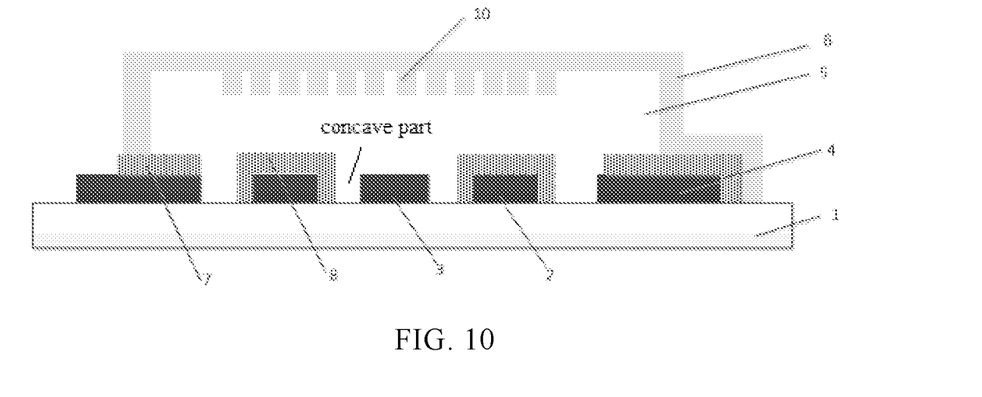
FIG. 10 illustrates a schematic cross-sectional structural view of a MEMS phase shifter according to an embodiment of the present disclosure.

FIG. 10 illustrates a schematic structural view of a MEMS phase shifter according to an embodiment of the disclosure. The MEMS phase shifter of this embodiment is an improvement based on the MEMS phase shifter shown in FIG. 2, and further includes a plurality of bumps 10 arranged on the metal film bridge 6 to protrude towards the coplanar waveguide signal line 2. The bumps 10 may be made of an organic material, for example, Optically Clear Adhesive (OCA), Photoresist (PR), Polyimide (PI), and the like. In the embodiment, the bumps in an array made of the organic material and protruding towards the coplanar waveguide signal line 2 are arranged on the metal film bridge 6, so that the contact area of the metal bridge when the metal bridge is pulled down and adsorbed to the insulating dielectric layer can be reduced, the adhesion risk is reduced, the failure of the MEMS phase shifter caused by the charging of the insulating dielectric layer during electrostatic driving of the MEMS phase shifter is reduced, the service life of the MEMS phase shifter is prolonged, and the working stability of the MEMS phase shifter is improved.

However, the present disclosure is not limited thereto, and as shown in FIG. 10, since the insulating dielectric layer 8 is provided on the coplanar waveguide signal line 2, a metal material such as nickel (Ni) or titanium (Ti), which is easily joined to a material of the metal film bridge 6, such as gold (Ag), may be used as a material of the bumps 10.

Figure 11:
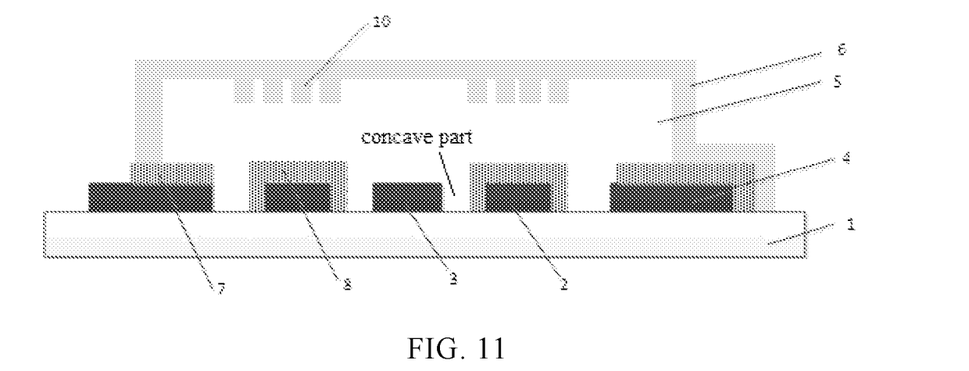
FIG. 11 illustrates a schematic cross-sectional structural view of a MEMS phase shifter according to an embodiment of the present disclosure.

In addition, as shown in FIG. 11, the bumps 10 may not be provided on the metal film bridge at a position corresponding to the driving electrode, and a plurality of bumps 10 arranged in an array may be provided only on the metal film bridge 6 at positions corresponding to the coplanar waveguide signal line 2.

In the MEMS phase shifter provided by the embodiment of the disclosure, the insulating dielectric layer arranged on the coplanar waveguide signal structure includes a plurality of insulating dielectric structures which are spaced apart from each other, so that gaps exist among the plurality of insulating dielectric structures, thereby reducing the failure of the MEMS phase shifter caused by the charging of the insulating dielectric layer during the electrostatic driving of the MEMS phase shifter, prolonging the service life of the MEMS phase shifter, and increasing the working stability of the MEMS phase failure.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A MEMS phase shifter, comprising:
a substrate;
a coplanar waveguide signal structure on the substrate;
two coplanar waveguide ground wires respectively at two sides of the coplanar waveguide signal structure;
insulating isolation layers respectively on the two coplanar waveguide ground wires; and
a metal film bridge across and over the coplanar waveguide signal structure and forming a gap with the coplanar waveguide signal structure, respective ends of the metal film bridge attached to the corresponding insulating isolation layers on the two coplanar waveguide ground wires, wherein
an insulating dielectric layer is provided on a surface of the coplanar waveguide signal structure facing the metal film bridge, and
the insulating dielectric layer comprises at least one concave part, which is concave in a direction towards the substrate, on a surface facing the metal film bridge.

2. The MEMS phase shifter according to claim 1, wherein
the coplanar waveguide signal structure comprises a driving electrode and a coplanar waveguide signal line spaced apart from the driving electrode; and
an orthographic projection of the concave part onto the substrate at least partially overlaps an orthographic projection of the driving electrode onto the substrate, and the orthographic projection of the driving electrode onto the substrate is within an orthographic projection of the coplanar waveguide signal line onto the substrate.

3. The MEMS phase shifter according to claim 2, wherein the orthographic projection of the driving electrode on the substrate polygon with right angles or round corners.

4. The MEMS phase shifter according to claim 2, further comprising a switching transistor configured to apply a direct current driving voltage between the driving electrode and the metal film bridge.

5. The MEMS phase shifter according to claim 2, wherein the insulating dielectric layer comprises a plurality of insulating dielectric structures separated from each other; and
the plurality of insulating dielectric structures are disposed only on the coplanar waveguide signal line.

6. The MEMS phase shifter according to claim 5, wherein the coplanar waveguide signal line comprises two branches respectively on two opposite sides of the driving electrode, and two of the plurality of insulating dielectric structures are disposed respectively on the two branches.

7. The MEMS phase shifter according to claim 6, wherein each of the two of the plurality of insulating dielectric structures covers a surface of the corresponding branch facing the metal film bridge and two side surfaces of the corresponding branch.

8. The MEMS phase shifter according to claim 7, wherein an inner edge of an orthographic projection of the coplanar waveguide signal line onto the substrate has a shape of a polygon; and
the polygon has inner angles of obtuse angles.

9. The MEMS phase shifter according to claim 8, wherein
the orthographic projection of the driving electrode onto the substrate is a rectangle with rounded corners, which comprises a first side and a third side as long sides of the rectangle; and
the orthographic projection of the coplanar waveguide signal line onto the substrate is an octagon, the octagon comprises a second side and a fourth side which are parallel to the first side and the third side, respectively, and the second and fourth sides are arranged at a side of the first side away from the third side and a side of the third side away from the first side, respectively, and
the two of the plurality of insulating dielectric structures are arranged on the second side and the fourth side, respectively.

10. The MEMS phase shifter according to claim 6, wherein
the insulating dielectric structure on each of the two branches comprises a plurality of insulating dielectric microstructures arranged in an array, the plurality of insulating dielectric microstructures being spaced apart from each other on a side facing the metal film bridge.

11. The MEMS phase shifter according to claim 10, wherein
each of the plurality of insulating dielectric microstructures is cylindrical, truncated cone-shaped, or conical on the side facing the metal film bridge.

12. The MEMS phase shifter according to claim 10, wherein a material of the insulating dielectric microstructures comprises an organic material.

13. The MEMS phase shifter according to claim 12, wherein the organic material comprises optically clear adhesive, photoresist or polyimide.

14. The MEMS phase shifter according to claim 1, wherein
the coplanar waveguide signal structure comprises a coplanar waveguide signal line arranged in parallel with the two coplanar waveguide ground wires; and
the insulating dielectric layer comprises a plurality of insulating dielectric microstructures, and the plurality of insulating dielectric microstructures are spaced apart from each other on a side facing the metal film bridge.

15. The MEMS phase shifter according to claim 14, wherein a material of the plurality of insulating dielectric microstructures comprises an organic material.

16. The MEMS phase shifter according to claim 14, wherein each of the plurality of insulating dielectric microstructures is cylindrical, truncated cone-shaped or conical on the side facing the metal film bridge.

17. The MEMS phase shifter according to claim 1, wherein the metal film bridge comprises a plurality of bumps in an array protruding in a direction towards the coplanar waveguide signal structure, the plurality of bumps being spaced apart from each other on a side towards the coplanar waveguide signal structure.

18. The MEMS phase shifter according to claim 17, wherein a material of the plurality of bumps comprises an organic material or a metallic material.

* * * * *